United States Patent
Zhao et al.

(10) Patent No.: US 7,553,753 B2
(45) Date of Patent: Jun. 30, 2009

(54) METHOD OF FORMING CRACK ARREST FEATURES IN EMBEDDED DEVICE BUILD-UP PACKAGE AND PACKAGE THEREOF

(75) Inventors: Jie-Hua Zhao, Plano, TX (US); George R. Leal, Cedar Park, TX (US); Robert J. Wenzel, Austin, TX (US); Scott K. Pozder, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 391 days.

(21) Appl. No.: 11/469,158

(22) Filed: Aug. 31, 2006

(65) Prior Publication Data

US 2008/0057696 A1 Mar. 6, 2008

(51) Int. Cl.
*H01L 21/44* (2006.01)
(52) U.S. Cl. .................. 438/614; 257/E21.503
(58) Field of Classification Search ........... 438/112, 438/614; 257/E21.503
See application file for complete search history.

(56) References Cited

U.S. PATENT DOCUMENTS 5,665,655 A * 9/1997 White ................. 438/584
6,806,168 B2 * 10/2004 Towle et al. ............. 438/460
6,960,519 B1 11/2005 Dalton et al.

OTHER PUBLICATIONS

Liu, X. H. et al.; "Developing design rules to avert cracking and debonding in integrated circuit structures"; Engineering Fracture Mechanics 66; 2000; pp. 387-402; Elsevier Science Ltd.; USA.

* cited by examiner

*Primary Examiner*—Chandra Chaudhari
(74) *Attorney, Agent, or Firm*—Susan C. Hill; Kim-Marie Vo

(57) ABSTRACT

A method of forming an embedded device build-up package (10) includes forming a first plurality of features (22) over a packaging substrate (12,16,18), wherein the first plurality of features (22) comprises a first feature and a second feature, forming at least a first crack arrest feature (28) in a first crack arrest available region (26), wherein the first crack arrest available region is between the first feature and the second feature, forming a second plurality of features (32) over the first plurality of features (22) wherein the second plurality of features includes a third feature and a fourth feature, and forming at least a second crack arrest feature (36) in a second crack arrest available region (34), wherein the second crack arrest feature (36) is between the third feature and the fourth feature, and the second crack arrest feature (36) is substantially orthogonal to the first crack arrest feature (28).

15 Claims, 5 Drawing Sheets

METHOD OF FORMING CRACK ARREST FEATURES IN EMBEDDED DEVICE BUILD-UP PACKAGE AND PACKAGE THEREOF

BACKGROUND

The present disclosures relate to semiconductor chip packaging, and more particularly, to a semiconductor chip package featuring crack arrest features and method of forming the crack arrest features.

In the process of manufacturing a package containing an embedded device for build-up package technology, dielectric brittleness and cracking occur due to thermal cycling, in particular, when using epoxy based photo defined dielectric or other similar low elongation organic dielectric materials. An embedded device build-up panel comprises one or more semiconductor die and an encapsulant. The encapsulant surrounds the one or more semiconductor die on at least three side surfaces of each semiconductor die, with at least an active side surface of the one or more semiconductor die exposed for further processing. In addition, the encapsulant generally comprises an epoxy based material, which has a glass transition temperature (Tg) of less than 180° C. Accordingly, low temperature processing would be advantageous for making the embedded device build-up panel. However, low temperature processing limits the selection of a build-up dielectric material.

Build-up dielectric materials can include traditional polyimide and Benzocylobutene (BCB) which are very tough and not susceptible to cracking. However, traditional polyimide and BCB materials need to be cured at a high temperature, greater than 200° C., (T_cure>200° C.). Accordingly, use of traditional polyimide and BCB materials for build-up dielectric material on an embedded device build-up panel is undesirable, due to the temperature processing constraint of the panel.

One temperature compatible dielectric material comprises, for example, a photo-imageable dielectric. In particular, the cure temperature for the photo-imageable dielectric is on the order of one hundred fifty degrees Celsius (T_cure=150° C.). However, the temperature compatible dielectric material has been found to be prone to fatigue cracking in regions above the die during reliability testing, which included temperature cycling.

Accordingly, there is a need for an improved method and apparatus for overcoming the problems in the art as discussed above. In particular, it would be desirable to provide a method and apparatus to confine a dielectric crack within a small area and suppress its growth in an embedded device build-up package.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

According to one embodiment of the present disclosure, a method comprises including crack arrest features, the crack arrest features comprising deliberately formed dummy lines and/or traces of a given crack arrest configuration, along with redistributed chip package traces within the build-up layers of an embedded device build-up package. A build-up layer includes, for example, a dielectric layer with an overlying circuit metal layer. The crack arrest features that are included within the build-up layers according to the embodiments of the present disclosure advantageously make a metal density of the build-up layers very high.

In one embodiment, the crack arrest feature includes one or more crack arrest traces formed within two or more of the overlying dielectric build-up layers of an embedded device build-up package, wherein orthogonally disposed crack arrest traces disposed in the respective dielectric layers divide the build-up dielectric layers into isolated blocks. A dielectric crack can thus be advantageously suppressed, in response to a dielectric crack propagating into the bounding metal lines of the crack arrestor feature, for a very short crack length. In other words, the crack arrest features according to the embodiments of the present disclosure confine any cracks to within a small area by pre-emptively suppressing the crack's growth or continued propagation. In contrast, with prior known embedded device build-up package and other package designs, the active metal traces are sparsely located, wherein any dielectric crack that forms in the build-up dielectric layers thereof will undesirably continue to propagate over a significant distance until the crack encounters one of the other sparsely located active metal traces in the build-up dielectric layers.

Figure 1:
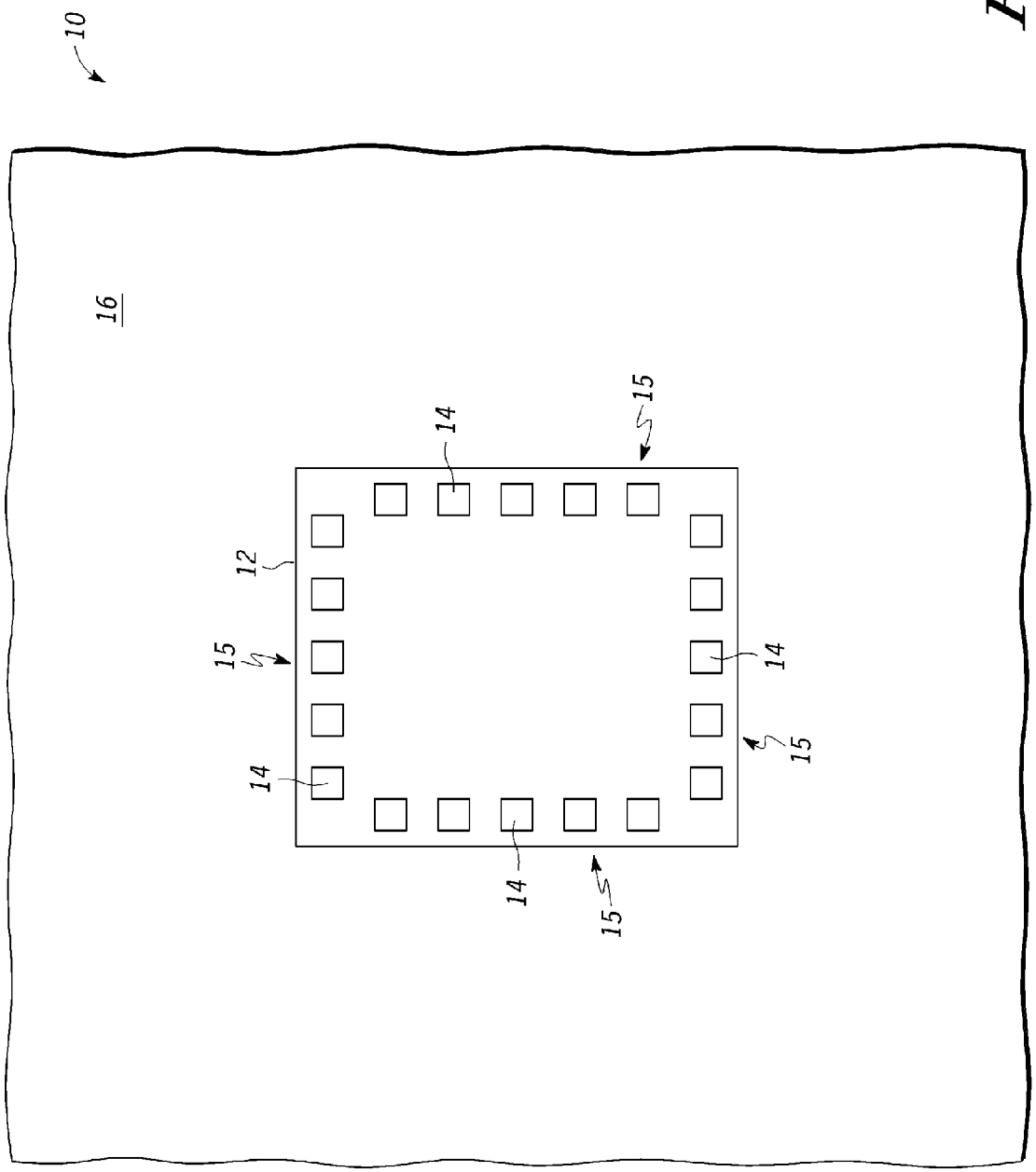
FIG. 1 is a top down layout view of an encapsulated semiconductor die in the formation of a semiconductor die package featuring crack arrest features according to one embodiment of the present disclosure.

FIG. 1 is a top down layout view of an encapsulated semiconductor die 12 in the formation of a semiconductor die package 10 featuring crack arrest features according to one embodiment of the present disclosure. While only one semiconductor die 12 is shown in FIG. 1, it should be understood that more than one semiconductor die 12 can be included in package 10. In addition, semiconductor die 12 comprises any suitable die or device, and can include a device other than a semiconductor device, requiring packaging. In one embodiment, semiconductor die 12 includes a plurality of bond pads 14 disposed on an active surface of the semiconductor die. An encapsulant 16 surrounds the semiconductor die 12 on at least three side surfaces of each semiconductor die, with at least the active surface of the one or more semiconductor die exposed for further processing. The encapsulant comprises an epoxy based material, which has a glass transition temperature (Tg) of less than 180° C. Glass transition temperature refers to the temperature at which the material changes from a solid rigid glass state into a soft viscous rubbery or liquid state. Accordingly, the low temperature processing of less than 180° C. would be advantageous for making the embedded device build-up panel.

Figure 2:
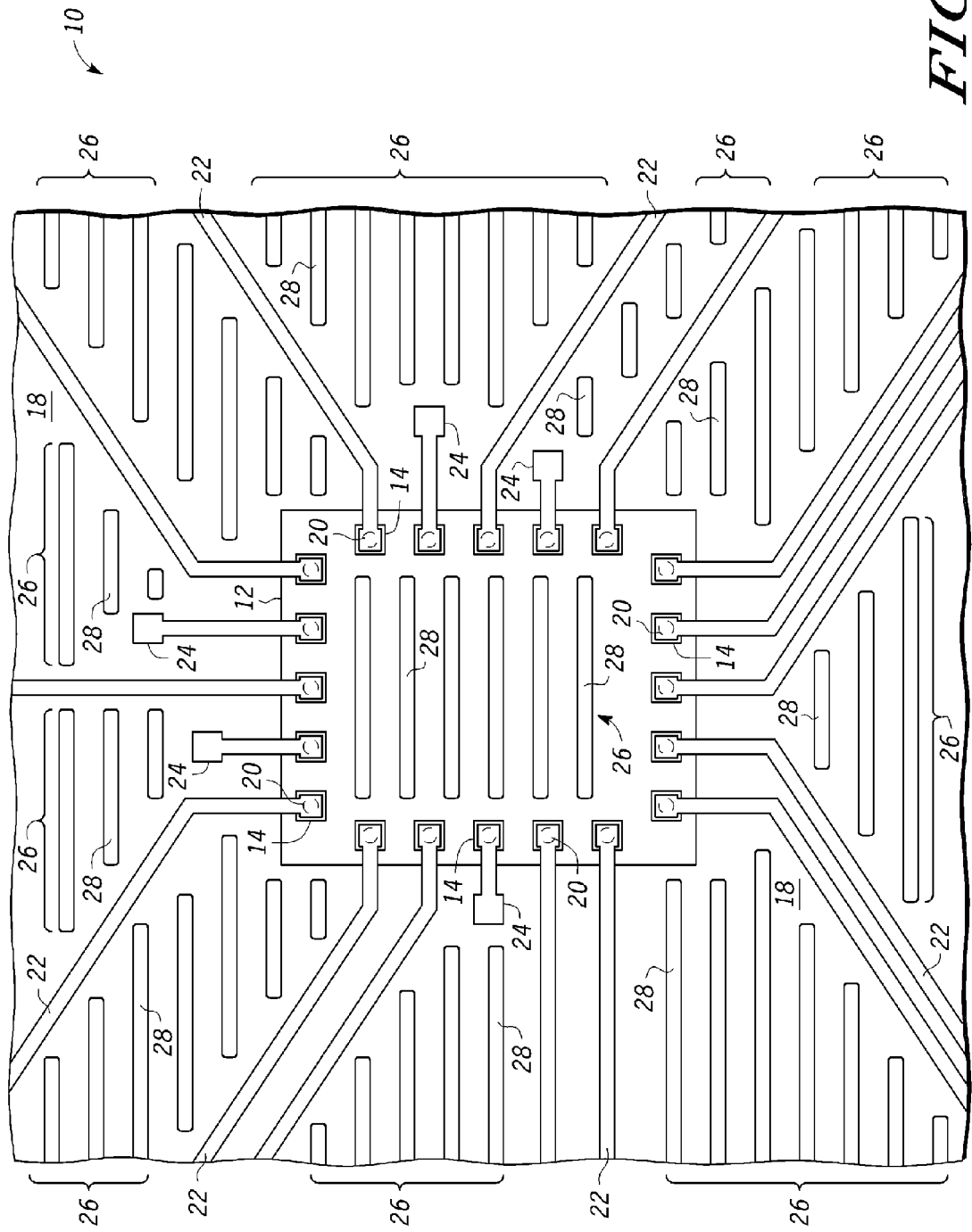
FIG. 2 is a top down layout view of crack arrest features formed within a first metal layer overlying a first dielectric overlying the encapsulated semiconductor die of FIG. 1 according to one embodiment of the present disclosure.

FIG. 2 is a top down layout view of crack arrest features formed within a first metal layer overlying a first dielectric 18 overlying the encapsulated semiconductor die 12 of FIG. 1 according to one embodiment of the present disclosure. The layout view includes active traces 22 of Metal 1, wherein the active traces 22 couple to a corresponding one of the bonding pads 14 on the active surface of the semiconductor die 12 using vias 20 through first dielectric 18. Other ends of active traces 22 include via pads 24, wherein some of the other ends (not shown) of active traces 22 extend outside the boundary of the illustration in FIG. 2.

Further with reference to FIG. 2, crack arrest features, generally indicated by reference numeral 26 are disposed in between sparsely located active traces 22, and formed of the Metal 1 layer metal. Metal 1 crack arrest features 26 comprise one or more crack arrest traces, as indicated by reference numeral 28, wherein the crack arrest traces are also formed of the Metal 1 layer metal. In the layout view of FIG. 2, note that the crack arrest traces 28 of Metal 1 crack arrest features 26 are generally parallel to one another.

In one embodiment, a crack arrest feature 26 is placed between two active traces based upon a given crack arrest availability specification. In one embodiment, the crack arrest availability specification comprises the adding of a crack arrest feature within areas or regions of a dielectric build-up layer meeting the following criteria. The criteria is whether an area or region in between active traces of a dielectric build-up layer of an embedded device build-up package contains a space that is three times (3×) the minimum trace width that can be formed based upon the capabilities of a metallization process being used among the dielectric build-up layers in a given embedded device build-up package fabrication method or application. As illustrated in FIG. 2, areas meeting the crack arrest availability specification include a region overlying the center of the semiconductor die 12, as well as a number of regions around the area of the semiconductor die 12 between Metal 1 active traces 22, as indicated by the presence of the crack arrest features 26 and the corresponding Metal 1 crack arrest traces 28.

Figure 3:
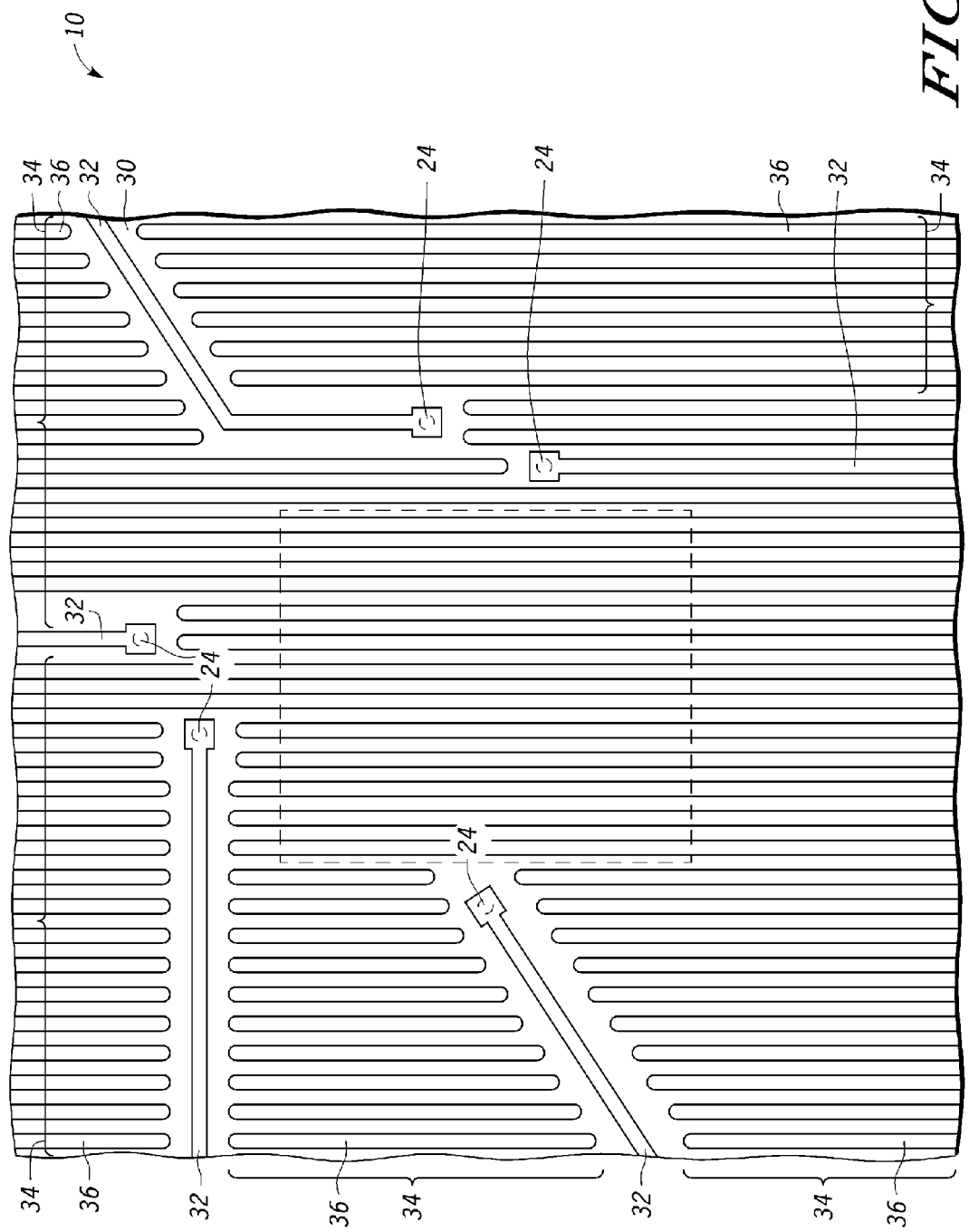
FIG. 3 is a top down layout view of crack arrest features formed within a second metal layer overlying a second dielectric overlying the crack arrest features formed within the first metal layer of FIG. 2 according to one embodiment of the present disclosure.

FIG. 3 is a top down layout view of crack arrest features formed within a second metal layer overlying a second dielectric 30 overlying the crack arrest features 26 formed within the first metal layer of FIG. 2 according to one embodiment of the present disclosure. The layout view includes active traces 32 of Metal 2, wherein the active traces 32 couple to a Metal 1 trace via pad 24 of a corresponding active trace 22 using a corresponding vias through second dielectric 30. Other ends of active traces 32 may include via pads (not shown). The other ends of active traces 32 extend outside the boundary of the illustration in FIG. 3.

Further with reference to FIG. 3, crack arrest features, generally indicated by reference numeral 34 are disposed in between sparsely located active traces 32, and formed of the Metal 2 layer metal. Metal 2 crack arrest features 34 comprise one or more crack arrest traces, as indicated by reference numeral 36, wherein the crack arrest traces are also formed of the Metal 2 layer metal. In the layout view of FIG. 3, note that the crack arrest traces 36 of Metal 2 crack arrest features 34 are generally parallel to one another. In addition, in one embodiment, the Metal 2 crack arrest traces 36 of crack arrest features 34 are disposed perpendicular to the Metal 1 crack arrest traces 28 of crack arrest features 26.

Similar to the Metal 1 crack arrest features 26, a Metal 2 crack arrest feature 34 is placed between two active traces 32 based upon a given crack arrest availability specification. In one embodiment, the crack arrest availability specification comprises the adding of a crack arrest feature within areas or regions of a dielectric build-up layer meeting the following criteria. The criteria is whether an area or region in between active traces of a dielectric build-up layer of an embedded device build-up package contains a space that is three times the minimum trace width that can be formed based upon the capabilities of a metallization process being used among the dielectric build-up layers in a given embedded device build-up package fabrication method or application. As illustrated in FIG. 3, areas meeting the crack arrest availability specification include a region overlying the center of the semiconductor die 12, as well as a number of regions around the area of the semiconductor die 12 between Metal 2 active traces 32, as indicated by the presence of the crack arrest features 34 and the corresponding Metal 2 crack arrest traces 36.

Figure 4:
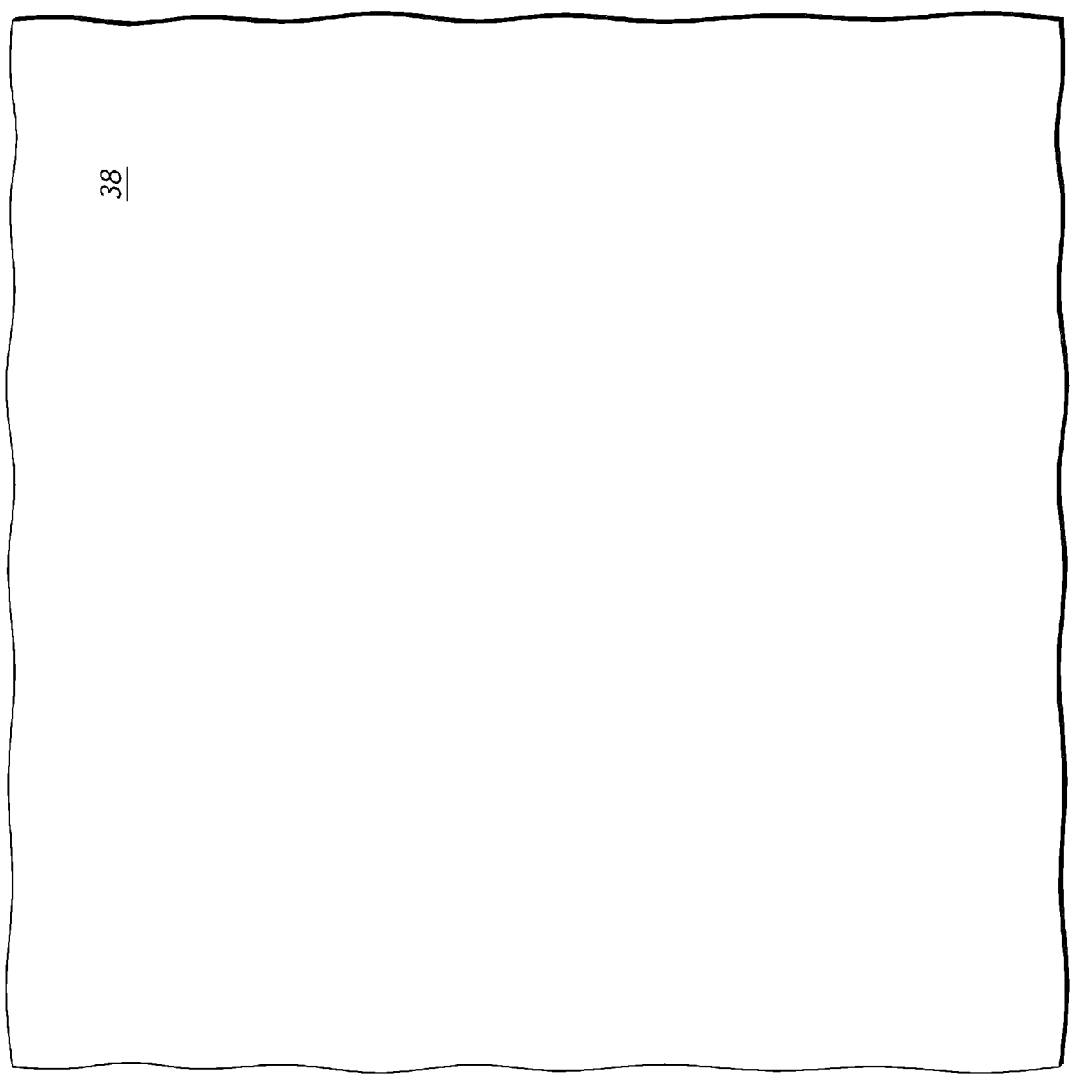
FIG. 4 is a top down layout view of a soldermask layer overlying the crack arrest features formed within the second metal layer of FIG. 3 according to one embodiment of the present disclosure.

FIG. 4 is a top down layout view of a soldermask layer 38 overlying the crack arrest features 34 formed within a second metal layer of FIG. 3 according to one embodiment of the present disclosure.

Figure 5:
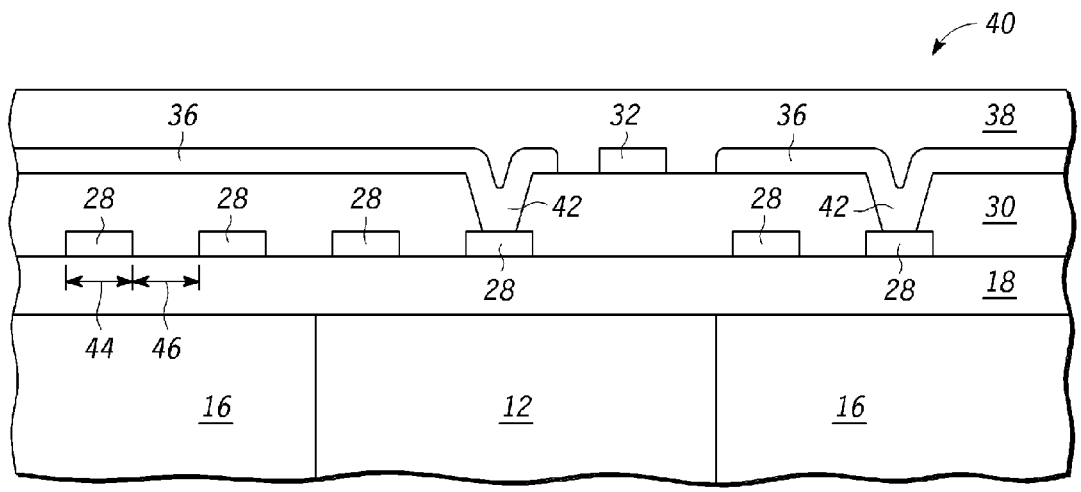
FIG. 5 is a cross-sectional view of an encapsulated semiconductor die in the formation of a semiconductor die package featuring crack arrest features, including vias coupling a crack arrest feature of a metal 1 layer to a crack arrest feature of a metal 2 layer according to another embodiment of the present disclosure.

FIG. 5 is a cross-sectional view of an encapsulated semiconductor die 12 in the formation of a semiconductor die package 40 featuring crack arrest features, including vias 42 coupling a crack arrest feature, in particular, a crack arrest trace 28 of a metal 1 layer to a crack arrest feature, in particular, a crack arrest trace 36 of a metal 2 layer according to another embodiment of the present disclosure. In the cross-sectional view of FIG. 5, there is illustrated the semiconductor die 12 surrounded by the encapsulant 16. Overlying the semiconductor die 12 and the encapsulant 16 is the first dielectric layer 18. Disposed overlying the first dielectric layer 18 is a number of Metal 1 crack arrest traces 28. The crack arrest traces 28 are characterized by a cross-sectional width dimension, as indicated by an arrow and reference numeral 44. Adjacent crack arrest traces 28 have a pitch on the order of twice the cross-sectional width of a single crack arrest trace. In other words, the pitch is the sum of the width dimensions indicated by reference numerals 44 and 46, wherein width dimension 46 is representative of a spacing width between adjacent crack arrest traces.

Overlying the first dielectric layer 18, the Metal 1 active traces (not shown), and the Metal 1 crack arrest traces 28 is the second dielectric layer 30. Disposed overlying the second dielectric layer 30 is a number of Metal 2 crack arrest traces 36. In this view, the Metal 2 crack arrest traces 36 are generally oriented perpendicular to the Metal 1 crack arrest traces 28. In one embodiment, the Metal 2 crack arrest traces 36 are characterized by a cross-sectional width dimension similar to that of the Metal 1 crack arrest traces 28. In addition, adjacent crack arrest traces 36 have a pitch on the order of twice the cross-sectional width of a single crack arrest trace.

Further with respect to FIG. 5, two vias are illustrated, as indicated by reference numeral 42. The vias 42 comprise Metal 2 to Metal 1 crack arrest vias. The Metal 2 to Metal 1 crack arrest vias 42 extend through the second dielectric layer 30, wherein the Metal 2 layer metal of a crack arrest feature trace 36 is brought into contact with, i.e., coupled with, the underlying Metal 1 layer metal of a corresponding crack arrest feature trace 28. Also illustrated in FIG. 5 is a cross-section of Metal 2 active trace 32. Furthermore, overlying the Metal 2 crack arrest feature traces 36 and the Metal 2 active trace 32 is soldermask 38.

Figure 6:
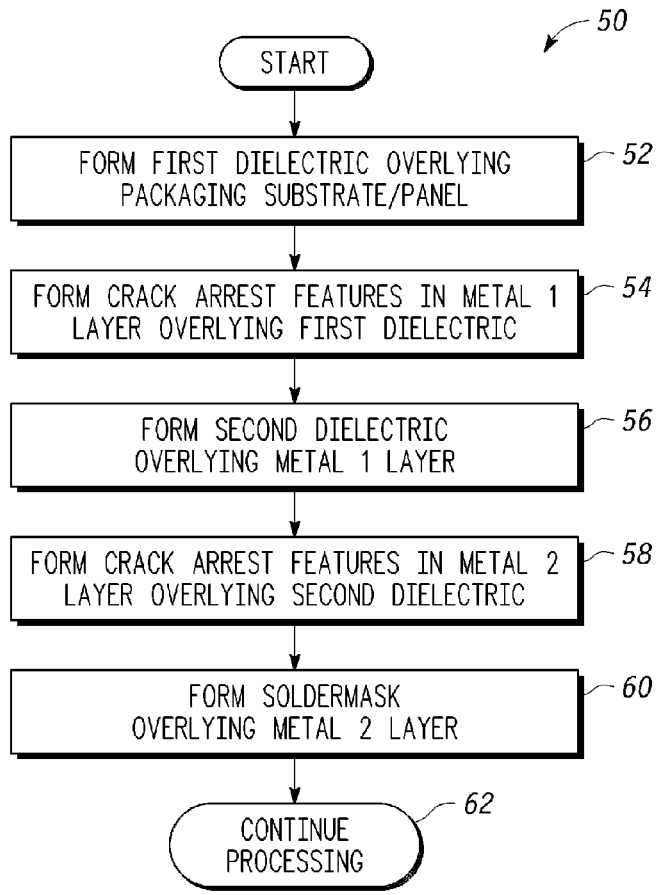
FIG. 6 is a flow diagram view of a method of forming an encapsulated semiconductor die in the formation of a semiconductor die package featuring crack arrest features according to another embodiment of the present disclosure.

FIG. 6 is a flow diagram view of a method 50 of forming an encapsulated semiconductor die in the formation of an embedded device build-up package featuring crack arrest features according to another embodiment of the present disclosure. In a first step 52, the method comprises forming a first dielectric layer overlying a packaging substrate/panel, in addition to forming any via holes in the first dielectric layer that may be needed for a given implementation. In one embodiment, the packaging substrate/panel can include one or more semiconductor die having three sides thereof surrounded by an encapsulant. In a second step 54, the method comprises forming any Metal 1 active traces and crack arrest features in a Metal 1 layer overlying a first dielectric. In one embodiment, the Metal 1 active traces, Metal 1 crack arrest features, and Metal 1 layer vias are formed concurrently. The first dielectric overlies the packaging substrate/panel. In addition, the crack arrest features include crack arrest traces. Furthermore, the crack arrest features are disposed between Metal 1 active traces, as discussed earlier herein.

In another step 56, the method comprises forming a second dielectric overlying the Metal 1 layer metallization, in addition to forming any via holes in the second dielectric layer that may be needed for a given implementation. In a next step 58, the method includes forming any Metal 2 active traces and crack arrest features in the Metal 2 layer overlying the second dielectric. In one embodiment, the Metal 2 active traces, Metal 2 layer crack arrest features, and Metal 2 layer vias are formed concurrently. In addition, the crack arrest features include crack arrest traces. Furthermore, the crack arrest features are disposed between Metal 2 active traces. Still further, various ones of the Metal 2 crack arrest traces of the Metal 2 crack arrest features can be coupled to an underlying Metal 1 crack arrest trace of the Metal 1 crack arrest features, with use of Metal 2 to Metal 1 crack arrest vias.

In one embodiment, a crack arrest feature is placed between two active traces of a given dielectric build-up/metallization layer based upon a given crack arrest availability specification. The crack arrest availability specification can comprise the adding of a crack arrest feature within areas or regions of a dielectric build-up layer meeting the following criteria. The criteria is whether an area or region in between active traces of a dielectric build-up layer of an embedded device build-up package contains a space that is three times (3×) the minimum trace width that can be formed based upon the capabilities of a metallization process being used among the dielectric build-up layers in a given embedded device build-up package fabrication method or application.

Subsequent to the forming of the Metal 2 crack arrest features, the method comprises forming a soldermask 38 overlying the Metal 2 layer metallization, wherein the Metal 2 layer metallization includes (i) Metal 2 active traces and (ii) Metal 2 crack arrest traces of the Metal 2 crack arrest features. Subsequently, the method continues with a further processing according to the requirements of a given embedded device build-up packaging process. The soldermask provides crack suppression from the surface. In addition, Energy Release Rate (ERR) is a measure of crack driving force (CDF), defined by stain energy released from the system when a crack extends a unit area. Higher ERR means larger crack driving force. It is already known that when a crack hits an interface of two materials perpendicular to the crack direction, if the crack comes from the compliant material going into the stiff material, the ERR will be zero at the interface. This phenomenon is called crack arresting at the material interface. When the crack in the dielectric hits a copper (Cu) trace, the ERR becomes zero due to the comparatively higher elastic modulus of the metal. Furthermore, the metal has a much higher fracture toughness, which provides additional resistance to cracking. Due to the same reason, the die has a much higher elastic modulus than the dielectric, the ERR is zero at the dielectric/die interface when cracking running from the dielectric into the die, given that the die does not crack and no delamination occurs at the die surface. Accordingly, the method includes using dense copper traces to stop a crack growth and uses a tough solder mask to suppress cracks from the surface. In other words, the solder mask 38 includes a fracture toughness having a higher elongation before fracture/failure than that of the dielectric layer 30.

The embodiments of the present disclosure provide a method and semiconductor die package that solves or reduces the impact of dielectric material brittleness and cracking when using an epoxy based photo defined dielectric (e.g., Intervia 8010) or similar low elongation organic dielectric materials. According to one embodiment, a novel design rule for embedded device build-up package manufacturing includes the use of crack arrest features to advantageously suppress dielectric cracking among build-up dielectric/signal/circuit layers. That is, the crack arrest features of the present embodiments advantageously confine a dielectric crack to within a small area and suppress a crack's growth. The embodiments of the present disclosure correspond to a design that includes the filling of otherwise unused areas of build-up dielectric/signal/circuit layers with tightly spaced orthogonal crack arrestor feature tracings. In one embodiment, the crack arrestor feature tracings can comprise copper.

Accordingly, the embodiments of the present disclosure include a method of forming a semiconductor device. The method comprises forming a first plurality of features 22 over a packaging substrate (collectively, 12, 16 and 18), wherein the first plurality of features 22 comprises a first feature and a second feature. At least a first crack arrest feature 28 is formed in a first crack arrest available region 26, wherein the first crack arrest available region is between the first feature and the second feature. In addition, the method includes forming a dielectric layer 30 over the first plurality of features 22 and at least the first crack arrest feature 28. Furthermore, the method includes forming a second plurality of features 32 over at least the dielectric layer 30, wherein the second plurality of features includes a third feature and a fourth feature. Still further, the method includes forming at least a second crack arrest feature 36 in a second crack arrest available region 34, wherein the second crack arrest feature is between the third feature and the fourth feature. The second crack arrest feature 36 is substantially orthogonal to the first crack arrest feature 28, also.

In another embodiment, forming at least the first crack arrest feature 28 further comprises forming at least a first dummy trace and forming at least the second crack arrest feature 36 further comprises forming at least a second dummy trace. In addition, forming at least the first crack arrest feature 28 further comprises forming the first crack arrest feature having a thickness of approximately 5 to approximately 10 microns. Furthermore, forming at least the second crack arrest feature 36 further comprises forming the second crack arrest feature having a thickness of approximately 5 to approximately 10 microns. Furthermore, forming at least the first crack arrest feature 28 still further comprises forming the first crack arrest feature, wherein the first crack arrest feature has a rounded end and forming at least the second crack arrest feature 36 still further comprises forming the second crack arrest feature, wherein the second crack arrest feature has a rounded end.

In yet another embodiment, the method further comprises forming an opening in the dielectric layer 30, wherein the opening 30 overlies at least a portion of the first crack arrest feature 28 and wherein forming at least the second crack arrest feature 36 further comprises forming a portion of the second crack arrest feature 36 within the opening, as indicated by reference numeral 42 of FIG. 5.

In another embodiment, the method includes forming the first plurality of features 22 over the packaging substrate, wherein the packaging substrate comprises a semiconductor die 12 and an encapsulant 16. The semiconductor die 12 comprises edges 15 and a plurality of contacts 14 on an active surface of the semiconductor die 12. The edges 15 are surrounded by the encapsulant 16. The plurality of contacts 14 comprises a first contact and a second contact. In addition, forming the first plurality of features 22, further comprises forming the first plurality of features, wherein the first feature and the second feature are coupled to a first contact and a second contact, respectively.

In yet another embodiment, the method of claim further comprises forming a solder mask 38 over the packaging substrate after forming at least the second crack arrest feature 36. Forming the solder mask 38 further comprises forming the solder mask, wherein the solder mask has a first fracture toughness and the dielectric layer 30 has a second fracture toughness and the first fracture toughness is greater than the second fracture toughness.

In another embodiment, forming at least a first crack arrest feature 28 further comprises forming the at least first crack arrest feature having a first thickness and wherein forming at least a second crack arrest feature 36 further comprises forming the at least second crack arrest feature having a second thickness. In one embodiment, the first thickness and the second thickness are substantially a same thickness. In a further embodiment, forming the first plurality of features 22 and forming at least the first crack arrest feature 28 are performed concurrently and forming the second plurality of features 32 and forming at least the second crack arrest feature 36 are performed concurrently.

In another embodiment, the method includes determining a first crack arrest available region between the first feature and the second feature by choosing a predetermined area of the first plurality of features 22, determining a predetermined density of the first plurality of features 22 of the predetermined area, and determining the predetermined area is the first crack arrest available region if a density of the predetermined area is below the predetermined density, wherein the predetermined density is less than approximately forty percent (40%).

In yet another embodiment, the method includes forming at least the first crack arrest feature 28, wherein the first crack arrest feature has a length and a width and the length is no greater than twenty times (20×) the width. In addition, the method includes forming at least the second crack arrest feature, wherein the second crack arrest feature has a length and a width and the length is no greater than twenty times (20×) the width.

In another embodiment, a semiconductor device 10 comprises: a first plurality of active features 22 coupled at a first level to a semiconductor die 12; a first plurality of crack arrest features 28 at the first level and formed over the semiconductor die 12; a dielectric 30 formed over the first plurality of active features 22 and the first plurality of crack arrest features 28; a second plurality of active features 32 coupled at a second level to the semiconductor die 12; and a second plurality of crack arrest features 36 at the second level and formed over the dielectric 30, wherein at least fifty percent (50%) of the first plurality of crack arrest features 28 are at an angle with respect to the second plurality of crack arrest features 36, wherein the angle is at least forty-five (45) degrees. In another embodiment, the angle is approximately ninety (90) degrees. In addition, the first plurality of crack arrest features 28 and the second plurality of crack arrest features 36 comprise dummy traces. Furthermore, the first plurality of crack arrest features 28 have first widths and the first plurality of active features 22 have second widths, wherein the first widths are different than the second widths. Still further, in another embodiment, the first plurality of crack arrest features 28 are coupled together and electrically grounded.

In the foregoing specification, the disclosure has been described with references to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, one embodiment of the present disclosure includes a dielectric crack arrestor feature used for embedded device build-up packaging and similar bumpless build up process.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of forming an embedded device build-up package, the method comprising:

forming a first plurality of features over a packaging substrate, wherein the first plurality of features comprises a first feature and a second feature;

forming at least a first crack arrest feature in a first crack arrest available region, wherein the first crack arrest available region is between the first feature and the second feature;

forming a dielectric layer over the first plurality of features and at least the first crack arrest feature;

forming a second plurality of features over at least the dielectric layer, wherein the second plurality of features includes a third feature and a fourth feature; and forming at least a second crack arrest feature in a second crack arrest available region, wherein:

the second crack arrest feature is between the third feature and the fourth feature; and the second crack arrest feature is substantially orthogonal to the first crack arrest feature.

2. The method of claim 1, wherein:
forming at least the first crack arrest feature further comprises forming at least a first dummy trace; and
forming at least the second crack arrest feature further comprises forming at least a second dummy trace.

3. The method of claim 2, wherein forming at least the first crack arrest feature further comprises forming the first crack arrest feature, wherein the first crack arrest feature has a thickness of approximately 5 to approximately 10 microns.

4. The method of claim 3, wherein forming at least the second crack arrest feature further comprises forming the second crack arrest feature, wherein the second crack arrest feature has a thickness of approximately 5 to approximately 10 microns.

5. The method of claim 2, wherein:
forming at least the first crack arrest feature further comprises forming the first crack arrest feature, wherein the first crack arrest feature has a rounded end; and
forming at least the second crack arrest feature further comprises forming the second crack arrest feature, wherein the second crack arrest feature has a rounded end.

6. The method of claim 1, further comprising:
forming an opening in the dielectric layer, wherein the opening overlies at least a portion of the first crack arrest feature, and wherein
forming at least the second crack arrest feature, further comprises forming a portion of the second crack arrest feature within the opening.

7. The method of claim 1, wherein forming the first plurality of features over the packaging substrate, further comprises forming the first plurality of features over the packaging substrate, wherein:
the packaging substrate comprises a semiconductor die and an encapsulant; and
the semiconductor die comprises edges and a plurality of contacts on an active surface of the semiconductor die;
the edges are surrounded by the encapsulant; and
the plurality of contacts comprise a first contact and a second contact.

8. The method of claim 7, wherein forming the first plurality of features, further comprises forming the first plurality of features, wherein the first feature and the second feature are coupled to a first contact and a second contact, respectively.

9. The method of claim 1, further comprising forming a solder mask over the packaging substrate after forming at least the second crack arrest feature.

10. The method of claim 9, wherein forming the solder mask further comprises forming the solder mask, wherein the solder mask has a first fracture toughness and the dielectric layer has a second fracture toughness and the first fracture toughness is greater than the second fracture toughness.

11. The method of claim 1, wherein:
forming at least a first crack arrest feature further comprises forming at least first crack arrest feature having a first thickness;
forming at least a second crack arrest feature further comprises forming at least second crack arrest feature having a second thickness; and
the first thickness and the second thickness are substantially a same thickness.

12. The method of claim 1, wherein:
forming the first plurality of features and forming at least the first crack arrest feature are performed concurrently; and
forming the second plurality of features and forming at least the second crack arrest feature are performed concurrently.

13. The method of claim 1, wherein determining a first crack arrest available region between the first feature and the second feature further comprises:
choosing a predetermined area of the first plurality of features;
determining a predetermined density of the first plurality of features of the predetermined area; and
determining the predetermined area is the first crack arrest available region if a density of the predetermined area is below the predetermined density, wherein the predetermined density is less than approximately 40%.

14. The method of claim 1, wherein:
forming at least the first crack arrest feature, further comprises forming at least the first crack arrest feature, wherein the first crack arrest feature has a length and a width and the length is no greater than 20 times the width; and
forming at least the second crack arrest feature, further comprises forming at least the second crack arrest feature, wherein the second crack arrest feature has a length and a width and the length is no greater than 20 times the width.

15. A method of forming an embedded device build-up package, the method comprising:
providing a semiconductor die, wherein the semiconductor die edges are surrounded by an encapsulant;
forming a first plurality of features over at least the encapsulant, wherein:
the first plurality of features comprises a first feature, a second feature, and a first space between the first feature and the second feature; and
the first space is of a size such that at least a first crack arrest feature can be formed within the first space;
forming at least the first crack arrest feature between the first feature and the second feature, wherein forming at least the first crack arrest feature is performed while forming the first plurality of features and the first crack arrest feature is a dummy trace; and
forming a second plurality of features over the first plurality of features, wherein:
the second plurality of features comprises a third feature, a fourth feature, and a second space between the third feature and the fourth feature;
the second space is of a size such that at least a second crack arrest feature can be formed within the second space;
forming at least the second crack arrest feature between the third feature and the fourth feature, wherein forming at least the second crack arrest feature is performed while forming the second plurality of features and the second crack arrest feature is a dummy trace.

* * * * *